US006803866B2

United States Patent
Brown et al.

(10) Patent No.: US 6,803,866 B2
(45) Date of Patent: Oct. 12, 2004

(54) EFFICIENT REPRESENTATION OF DATE/TIME INFORMATION

(75) Inventors: Kevin Brown, San Rafael, CA (US); Michael John Elvery Spicer, Lafayette, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/322,607

(22) Filed: Dec. 19, 2002

(65) Prior Publication Data

US 2004/0119617 A1 Jun. 24, 2004

(51) Int. Cl.[7] ............................................. H03M 7/00
(52) U.S. Cl. ..................... 341/90; 707/200; 707/206; 707/318; 370/252
(58) Field of Search ...................... 341/90, 50, 60, 341/51; 709/247, 216, 217, 227, 223; 707/200, 206, 318, 1; 386/4, 65, 60, 62; 370/252; 380/246

(56) References Cited

U.S. PATENT DOCUMENTS

| | | | |
|---|---|---|---|
| 6,011,899 A | 1/2000 | Ohishi et al. | 386/98 |
| 6,148,309 A | 11/2000 | Azagury et al. | 707/206 |
| 6,188,766 B1 * | 2/2001 | Kocher | 380/246 |
| 6,202,060 B1 * | 3/2001 | Tran | 707/3 |
| 6,327,584 B1 * | 12/2001 | Xian et al. | 707/1 |
| 6,377,993 B1 | 4/2002 | Brandt et al. | 709/227 |
| 6,526,323 B1 * | 2/2003 | Miyajima et al. | 700/9 |
| 6,535,925 B1 * | 3/2003 | Svanbro et al. | 709/247 |
| 6,611,498 B1 * | 8/2003 | Baker et al. | 370/252 |

OTHER PUBLICATIONS

CLarke, "device and method for data timestamping" US application No. 10/073,261 filed on Feb. 13, 2002.*
Notoya et al., "Data conversion apparatus, data coding apparatus and data recording apparatus", US application No. 10/005,329 filed on Dec. 7, 2001.*
Lomet, "Time Stamp Of Database Records", US application No. 09/939,180 filed on Aug. 24, 2001.*

* cited by examiner

Primary Examiner—Jean Bruner Jeanglaude
(74) Attorney, Agent, or Firm—Sughrue Mion, PLLC

(57) ABSTRACT

Methods, apparatus and data structures are described for representing, storing and manipulating date/time information in an 8-byte timestamp format. By limiting date/time information to a predetermined range and specifying a single date/time structure, an 8-byte timestamp is generated that is capable of conveying the same operational information as conventional 24-byte timestamps, yet which can be more efficiently generated, more efficiently stored, and more efficiently evaluated in boolean operations.

33 Claims, 2 Drawing Sheets

US 6,803,866 B2

EFFICIENT REPRESENTATION OF DATE/TIME INFORMATION

BACKGROUND OF THE INVENTION

1. Field of the Invention

The invention relates to representation, storage and manipulation of timestamps. More particularly, it relates to new methods, apparatus and data structures for transforming date/time information into an efficiently stored and easily manipulated data structure for use in computer systems.

2. Description of the Related Art

Conventional methods for the representation and storage of date/time information are highly inefficient.

For example, the INFORMIX® database uses a 24-byte timestamp structure for representing date/time information. These timestamps take the form of YYYY-MM-DD HH-mm-SS.FFFFF where YYYY is the year, MM the month, DD the Day, HH the hour, mm the minute, SS the second, and FFFFF the number of 10's of microseconds. Although such a representation includes metadata information that allows it to store many kinds of date/time information, including such information makes the timestamp much larger than necessary to represent many simpler date/time information formats. The resulting 24-byte structure is, therefore, time consuming to construct from date/time information, makes inefficient use of available memory and cannot be efficiently evaluated in boolean comparison operations.

For example, a 24-byte timestamp structure is ill-suited for use with in-memory timestamped data, such as time series data. In such an operation scenario, the number of records that can be stored in memory is directly related to the size of the records. A smaller record size allows a larger number of records to be fit in a fixed amount of memory space. By increasing the number of records that fit in memory, the number of disk I/O operations required to support page in/out record operations is reduced.

By way of an operational example, if an in-memory database were used to track the trading price of a publicly traded stock, a typical record would include a timestamp and a single floating point number that is used to record the value of the stock at the time indicated by the timestamp. In such a case, each record would require 24-bytes of storage for the timestamp and 8-bytes for the floating point number, making the overhead for the timestamp three times that of the information that the application is designed to track. Therefore, in 1024-bytes of memory there could be at most 32 of the 32-byte records. If the size of a timestamp is reduced to 8-bytes, the number of records that could be stored in 1024-bytes of memory would increase to 64, thus doubling the number of records that could be stored in the same amount of memory.

Conventional methods for creating, representing and storing date/time information require significant processor resources. For example, with respect to the 24-byte INFORMIX® timestamp, not only is the timestamp encoded into a binary string, additional metadata bytes are set to indicate such variables as: the granularity of the date/time information; the number of bytes actually present in the date string; a positive/negative/null indicator; and, a count of the number of fields in the structure prior to the microseconds information. In total, five fields must be set when constructing an INFORMIX® timestamp. Furthermore, in executing a boolean comparison of two such timestamps, all these fields must be checked. As a result, performance of boolean timestamp comparisons, using conventional timestamp techniques, are very inefficient.

Other conventional techniques for efficiently representing date/time information suffer from other, yet equally strong deficiencies. For example, conventional methods for converting timestamps into 8-byte representations are slow to create. These solutions typically involve picking some epoch in time, such as Jan. 1, 1970, and then calculating the number of seconds and microseconds between a given timestamp and the epoch. Such an approach is complicated and inefficient, since the conversion of date/time information to such a format must handle leap years, leap seconds and leap microseconds. Such approaches typically include a time zone, associated with converted time stamps, that must be accounted for when processing such timestamps. Because of this complexity, it is time consuming to convert date/time information to one of these conventional 8-byte timestamp formats.

There remains a strong need for more efficient methods, apparatus and data structures for storing and manipulating date/time information.

SUMMARY OF THE INVENTION

Therefore, in light of the above, and for other reasons that will become apparent when the invention is fully described, methods, apparatus and data structures for representing, storing and manipulating timestamps are described here.

Methods, apparatus and data structures are described for representing, storing and manipulating date/time information in an 8-byte timestamp format. By limiting date/time information to a range between 0001-01-01 00:00:00.00000 and 18446-12-31 23:59:59:99999 and specifying a single date/time granularity, an 8-byte timestamp is generated that is capable of conveying the same operational information as conventional 24-byte timestamps, yet which can be more efficiently generated, more efficiently stored, and more efficiently evaluated using boolean operations.

The above features and advantages of the invention will become apparent upon consideration of the following descriptions and descriptive figures of specific embodiments thereof. While these descriptions go into specific details of the invention, it should be understood that variations may and do exist and would be apparent to those skilled in the art based on the descriptions herein.

DETAILED DESCRIPTION

Figure 1:
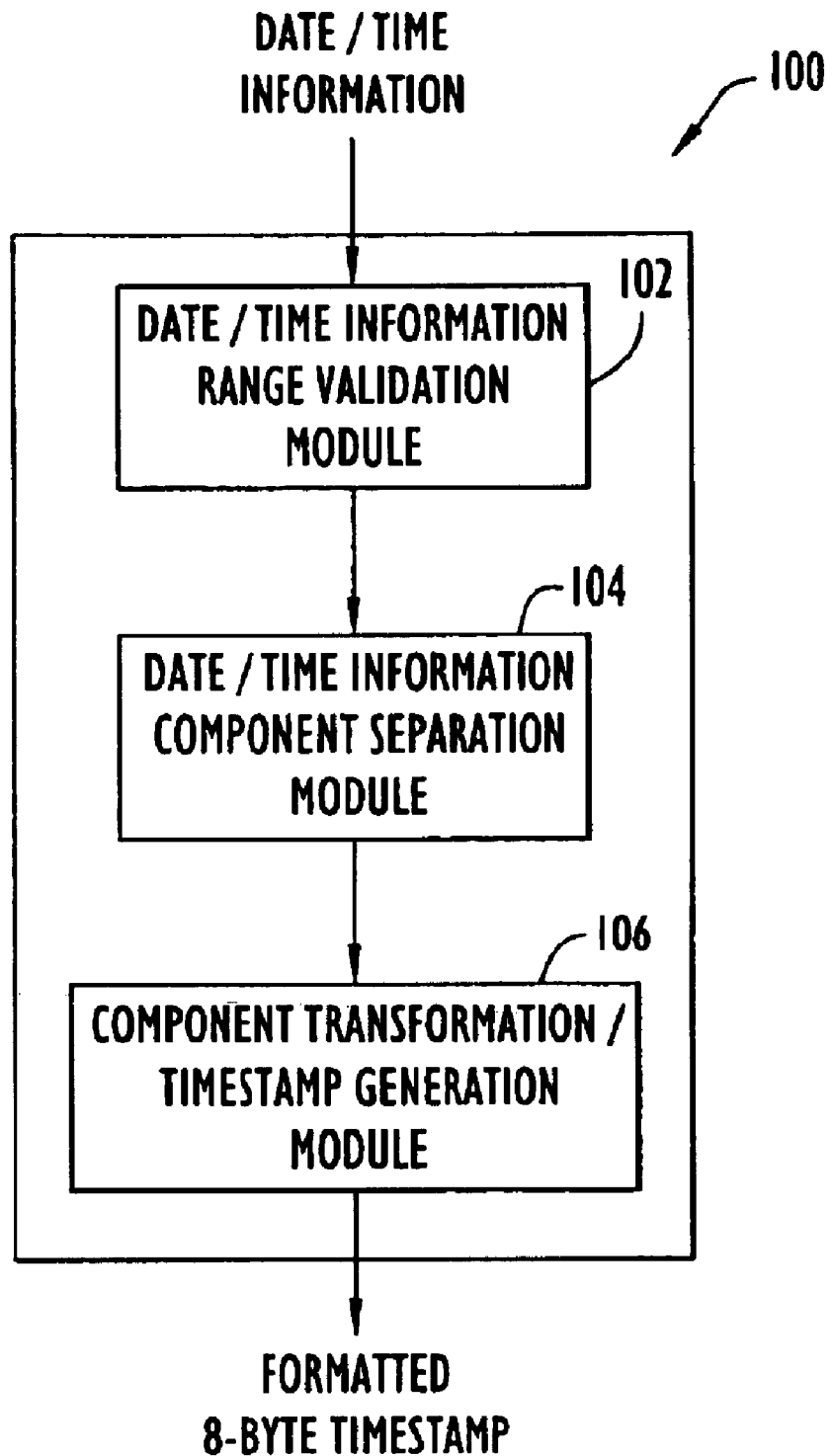
FIG. 1 is a non-limiting, representative system level block diagram of an apparatus capable of efficiently converting date/time information into timestamps in accordance with the methods and techniques described here.

The embodiments described below are described with reference to the above drawings, in which like reference numerals designate like components.

The methods, apparatus and data structures for representing, storing and manipulating timestamps, described here, are based upon knowledge that by accepting several operationally non-limiting constraints, it is possible to reduce the size of a timestamp to eight bytes, rather than the 24-bytes used by conventional techniques, as described above. The new approach reduces the cost (i.e., processing resources) required to build the 8-byte timestamp and reduces the cost of comparing two timestamps in standard boolean operations.

The first constraint used is to place an upper and lower bound upon the range of time that can be represented using the timestamp. The conventional 24-byte timestamps can represent any date greater or equal to January 1 in the year 1. By placing an upper bound upon the maximum date/time information that can be represented by the timestamp, which is not done in the conventional methods, it is possible to reduce the size of the timestamp without restricting the practical operational use of the timestamp. Therefore, the timestamp methods, apparatus, and data structures described here are limited to representing date/time information between 0001-01-01 00:00:00.00000 to 18446-12-31 23:59:59:99999. For all practical purposes, such a limitation is not operationally limiting for it is highly unlikely that any application and data gathered today will be running in the year 18446 A.D.

The second constraint imposed is with respect to the granularity of the date/time information represented in the timestamp. For example, conventional 24-byte structures support different date/time granularities, such as a year to day timespan (e.g., year+month+day), year to hour time span (e.g., year+month+day+hour), year to 5 decimal place time span (e.g., year+month+day+hour+second+10's of microseconds). The timestamp methods, apparatus, and data structures described here are limited to representing date/time information in the year to 5 decimal place fraction format. By choosing the smallest granularity supported by conventional techniques, such as the 24-byte technique adopted by INFORMIX®, it is possible to represent any conventional timestamp using the new 8-byte format described here, assuming that the date/time information to be represented by the timestamp is between 0001-01-01 00:00:00.00000 and 18446-12-31 23:59:59:99999, as described above.

64-bit operations, the format of the new timestamp that includes the two constraints identified above is set forth in equation 1, below:

$$\text{Timestamp} = (\text{year} \times 10^{15}) + (\text{month} \times 10^{13}) +$$
$$(\text{day} \times 10^{11}) + (\text{hour} \times 10^{9}) + (\text{minute} \times 10^{7}) +$$
$$(\text{second} \times 10^{5}) + (10\text{'s of microseconds})$$
$$\text{wherein the maximum year is 18446 A.D} \quad \text{Eq. 1}$$

Given the date range constraints described above, this formula produces a number that will always fit into an eight byte word. Since the format does not require metadata fields, construction of the timestamp from date/time information is much simpler. Furthermore, the generated timestamps can be easily compared using simple boolean comparison procedures in memory, such as IBM Corporation's memcmp procedure. This allows for very fast comparisons of timestamps compared to conventional timestamp comparison techniques, as described above.

Table 1, below, presents three representative timestamps generated for three separate date/time values. Example #1 in Table 1, presents the maximum timestamp that can be generated using the techniques described here. Examples #2 and #3 depict date/time values with exactly 200 years separation. In each example, component values are generated by multiplying the date/time part value by the indicated scalar value. The generated component values are then added together to generate the timestamp final value indicated for each example. Each generated timestamp is capable of being stored in an 8-byte (i.e., 64 bit) data structure. Note that all of the timestamp final values are less than $2^{64}-1$, which is the maximum value that can be achieved with 64 binary bits. The computed value of $2^{64}-1$ is indicated below for each generated timestamp value for comparison purposes only.

TABLE 1

Representative Timestamp Values (64-bit machine):

| Part | Scalar | Example #1 - Maximum Date Dec. 31, 18446; 23:59:59:99999 | | Example #2 Dec. 31, 2003; 9:15:45:00300 | | Example #3 Dec. 31, 2203; 9:15:45:00300 | |
|---|---|---|---|---|---|---|---|
| | | Value | Component Value | Value | Component Value | Value | Component Value |
| Year | 1E + 15 | 18446 | 18446000000000000000 | 2003 | 2003000000000000000 | 2203 | 2203000000000000000 |
| Month | 1E + 13 | 12 | 120000000000000 | 12 | 120000000000000 | 12 | 120000000000000 |
| Day | 1E + 11 | 31 | 3100000000000 | 31 | 3100000000000 | 31 | 3100000000000 |
| Hour | 1E + 09 | 23 | 23000000000 | 9 | 9000000000 | 9 | 9000000000 |
| Minute | 1E + 07 | 59 | 590000000 | 15 | 150000000 | 15 | 150000000 |
| Second | 1E + 05 | 59 | 5900000 | 45 | 4500000 | 45 | 4500000 |
| 10's of Micro | 1 | 99999 | 99999 | 300 | 300 | 300 | 300 |
| Timestamp Final Values: | | | 18446123123595999999 | | 2003123109154500300 | | 2203123109154500300 |
| Comparison Value $2^{64}-1$ | | | 18446744073709599999 | | 18446744073709599999 | | 18446744073709599999 |

This format constraint does not limit the operational usefulness of the timestamp. For example, in real-time market data-capture systems the granularity must be down to the 10's of microseconds, yet dates much more that ±20 years from the current date are almost never used. For such systems, the constraints identified above will impose no operational limitations.

Assuming that the timestamps are generated using a 64-bit processor, or a 32-bit processor capable of performing However, if the timestamps are generated using a 32-bit processor that is not capable of manipulating 64-bit data structures, the timestamp can be broken into two 32-bit (4-byte) components. Table 2, below, presents three representative timestamps generated for the same three date/time values used in Table 1, but wherein a 32-bit constraint is imposed. As in Table 1, component values are generated by multiplying the date/time part value by the indicated scalar value. However, the date/time information is placed into two 32-bit structures, rather than a single 64-bit structure. Note that both of the 32-bit timestamp values are less than $2^{32}-1$, which is the maximum value that can be achieved with 32 binary bits. The computed value of $2^{32}-1$ is indicated below each generated 32-bit timestamp value for comparison purposes only. Also note that as a result of restricting a timestamp to two 32-bit values, rather than to a single 64-bit value, the maximum year that can be accommodated is 4294 A.D., as indicated in Table 2.

Assuming that the timestamps are generated using a 32-bit processor not capable of performing 64-bit operations, the format of the new timestamp that includes the two constraints identified above is set forth in equation 2, below:

$$\begin{aligned} \text{1st 4-Bytes of Timestamp} &= (\text{year} \times 10^6) + \\ & (\text{month} \times 10^4) + (\text{day} \times 10^2) + (\text{hour}) \\ \text{2nd 4-Bytes of Timestamp} &= (\text{min} \times 10^7) + \\ & (\text{seconds} \times 10^5) + (10\text{'s of microseconds}) \end{aligned} \quad \text{Eq. 2}$$

wherein the maximum year is 4294 A.D.

extracted, etc., from the date/time information. By way of a second example, time/date information in the form of a formatted string can be parsed and the date/time component information extracted. Based upon the requirements of the associated application program using the timestamp, the date/time information component separation module 104 inserts placeholders for date/time components (such a zeros in place of FFFFF) that are not included with the received date/time information. The date/time components are passed to the component transformation/timestamp generation module 106 where each component is transformed, as described with respect to Table 1, above. Finally, the transformed components are added, or concatenated, thereby resulting in an 8-byte timestamp formatted as described in relation to Table 1. Alternatively, if a 32-bit constraint is imposed, the transformed components are added, or concatenated, to form two 4-byte (32-bit) timestamp values, as described with respect to Table 2.

Figure 2:
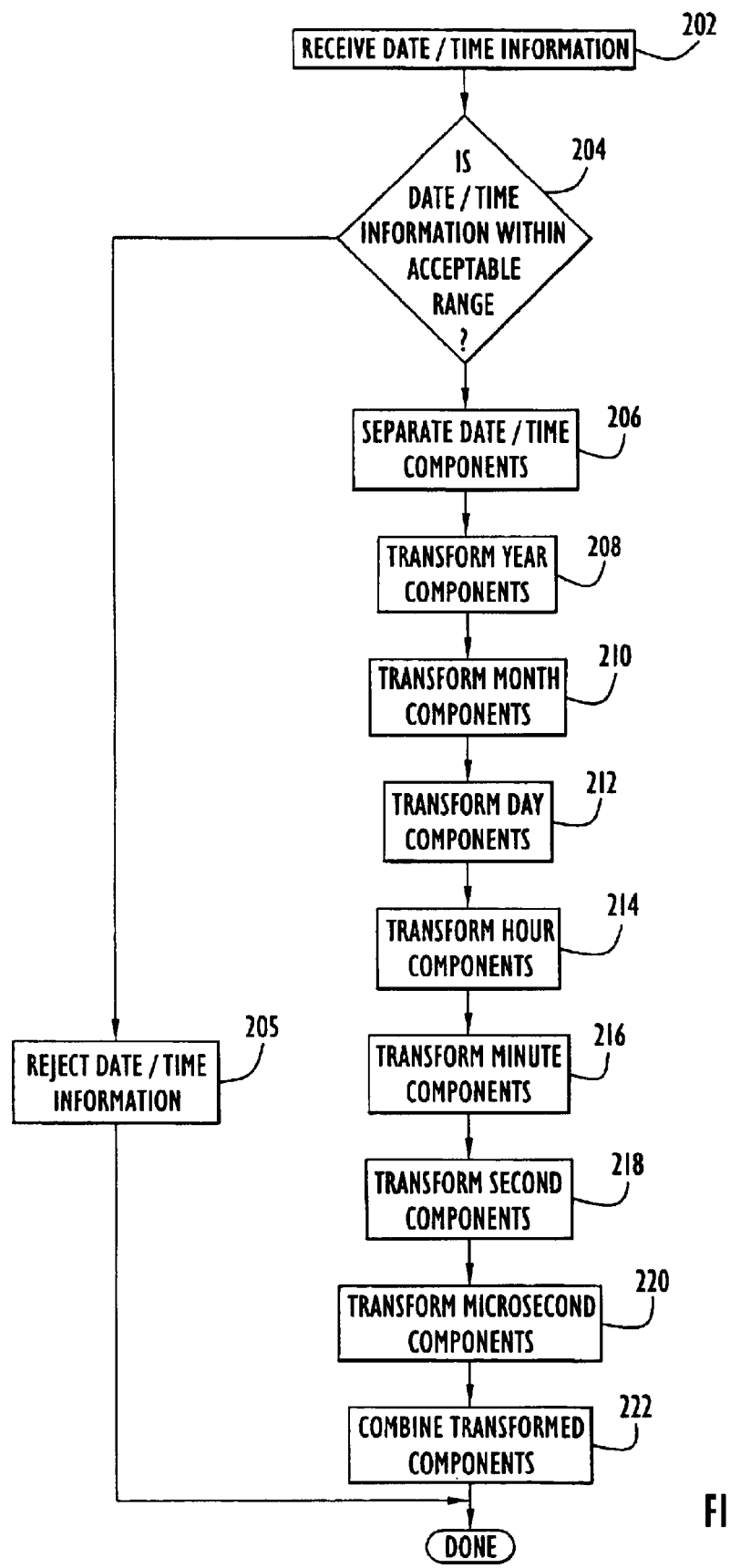
FIG. 2 is a non-limiting, representative flow chart illustrating a process associated with efficiently converting date/time information into timestamps in accordance with the methods and techniques described here.

FIG. 2 is a non-limiting, representative flow chart illustrating a process associated with efficiently converting date/time information into timestamps in accordance with the methods and data structures described here. First, in operation 202, the date/time information range validation module receives date/time information and validates, in operation 204, that the received date/time information is within the

TABLE 2

Representative Timestamp Values (32-bit machine):

| Part | Scalar | Example #1 - Maximum Date Dec. 31, 4294; 23:59:59:99999 | | Example #2 Dec. 31, 2003; 9:15:45:00300 | | Example #3 Dec. 31, 2203; 9:15:45:00300 | |
|---|---|---|---|---|---|---|---|
| | | Value | Component Value | Value | Component Value | Value | Component Value |
| Year | 1E + 6 | 4292 | 4292000000 | 2003 | 2003000000000000000 | 2203 | 2203000000000000000 |
| Month | 1E + 4 | 12 | 120000 | 12 | 120000000000000 | 12 | 120000000000000 |
| Day | 1E + 2 | 31 | 3100 | 31 | 3100000000000 | 31 | 3100000000000 |
| Hour | 1 | 23 | 23 | 9 | 09000000000 | 9 | 9000000000 |
| Minute | 1E + 07 | 59 | 590000000 | 15 | 150000000 | 15 | 150000000 |
| Second | 1E + 05 | 59 | 5900000 | 45 | 4500000 | 45 | 4500000 |
| 10's of Micro | 1 | 99999 | 99999 | 300 | 00300 | 300 | 300 |
| | | First 4 Bytes / 2nd 4 Bytes | | First 4 Bytes / 2nd 4 Bytes | | First 4 Bytes / 2nd 4 Bytes | |
| Timestamp Final Values: | | 4294123123 / 595999999 | | 2003123109 / 154500300 | | 2203123109 / 154500300 | |
| Comp. Values $2^{32}-1$ | | 4294967295 / 4294967295 | | 4294967295 / 4294967295 | | 4294967295 / 4294967295 | |

FIG. 1 is a non-limiting, representative system level block diagram of a timestamp generator 100 capable of efficiently converting date/time information into timestamps in accordance with the described methods and techniques described here. The timestamp generator 100 includes three modules: a date/time information range validation module 102; a date/time information component separation module 104; and, a component transformation/timestamp generation module 106.

As shown in FIG. 1, the date/time range validation module 102 receives date/time information and validates that the received date/time information is within the date/time range supported by the timestamp generator 100, thereby meeting the first constraint described above. Validated date/time information is then passed to the date/time information component separation module 104 where the validated date/time information is separated into it respective date/time components. For example, date/time information received in the form of an INFORMIX® timestamp can be parsed and information pertaining to YYYY-MM-DD HH-mm-ss.FFFFF, as described above, is extracted. That is, the year is extracted, the month is extracted, the day is date/time range supported by the timestamp generator, as described above.

If the date/time information fails range validation, in operation 204, the date/time information is rejected, in operation 205, and an error message is returned to the application program and timestamp generation processing terminates. However, if the date/time information is validated, in operation 204, the validated date/time information is passed to the date/time information component separation module where the validated date/time information is separated, in operation 206, into it respective date/time components. Next, as shown in operations 208, 210, 212, 214, 216, 218 and 220, each of the respective date/time components (i.e., year, month, day, hour, minute, second and microsecond) is passed to the transformation/timestamp generation module for transformation, as described above with respect to Table 1. These components can be processed serially or in parallel. Specifically, each date/time component is converted to a numeric representation and multiplied by a scalar value, as described above with respect to Table 1. Finally, as shown in operation 222, the transformed timestamp components are then added, or concatenated, resulting in an 8-byte timestamp, formatted as described with respect to Table 1. Alternatively, if a 32-bit constraint is imposed, the transformed components are added, or concatenated, to form two 4-byte (32-bit) timestamp values, as described with respect to Table 2.

It will be appreciated that the embodiments described above and illustrated in the drawings represent only a few of the many ways of implementing a timestamp generator capable of generating an 8-byte timestamp, formatted as described here.

It is to be understood that the software for the timestamp generator described here can be implemented in virtually any desired computer language and can be developed by one of ordinary skill in the computer arts based on the descriptions contained here and the flow charts illustrated in the drawings. The timestamp generator, alternatively, can be implemented by hardware or other processing circuitry. The various functions of the timestamp generator can be distributed in a variety of manners among practically any quantity of computer or processing systems or circuitry and/or among practically any quantity of software and/or hardware units or modules. The software and/or algorithms described above and illustrated in the flow charts can be modified in a manner that accomplishes the functions described herein.

The timestamp generator can be stored on recorded medium (e.g., floppy diskettes, CD-ROM, memory devices, etc.) for loading on stand-alone systems or systems connected by a network, or can be downloaded (e.g., in the form of carrier waves, packets, etc.) to systems from a network. The timestamp generator can be integrated within or implemented to operate in conjunction with any database information system using storage structures on any information storage device.

The present invention is not limited to the specific applications disclosed herein, but can be used in substantially the same manner described above to implement a timestamp generator that includes all or a portion of the 8-byte format described here.

Having described methods and apparatuses related to the operation and use of a timestamp generator that operates on date/time information within the date/time range specified above, to generate a formatted 8-byte timestamp, as described here, it is believed that other modifications, variations and changes will be suggested to those skilled in the art in view of the teachings set forth herein. It is therefore to be understood that all such variations, modifications and changes are believed to fall within the scope of the present invention as defined by the appended claims. Although specific terms are employed herein, they are used in their ordinary and accustomed manner only, unless expressly defined differently herein, and not for purposes of limitation.

TRADEMARKS

IBM® is a trademark or registered trademark of International Business Machines, Corporation in the United States and other countries. INFORMIX® is a trademark or registered trademark of Informix Software, Inc., in the United States and other countries.

What is claimed is:

1. A method of generating a timestamp in a computer, comprising:
   receiving at least one of date and time information;
   validating that the received at least one of date and time information is within a predetermined time range;
   separating the received at least one of date and time information into a plurality of components;
   scaling each of the plurality of components by a predetermined scale factor to generate a plurality of scaled components; and
   combining the plurality of scaled components to generate the timestamp.

2. The method of claim 1, wherein said plurality of components comprises at least one of a year component, a day component, an hour component, a minute component and a second component.

3. The method of claim 1, wherein said plurality of components comprises a year component, a day component, an hour component, a minute component and a second component.

4. The method of claim 3, wherein said scaling comprises:
   multiplying the year component by a year scale factor;
   multiplying the day component by a day scale factor;
   multiplying the hour component by an hour scale factor;
   multiplying the minute component by a minute scale factor; and
   multiplying the second component by a second scale factor.

5. The method of claim 4, wherein the plurality of components further comprises a subseconds component and said scaling further comprises multiplying the subseconds component by a subseconds scale factor.

6. The method of claim 4, wherein the plurality of scaled components are combined by adding the plurality of scaled components.

7. The method of claim 4, wherein the plurality of scaled components are combined by concatenating the plurality of scaled components.

8. The method of claim 1, wherein the generated timestamp is a 64-bit value.

9. The method of claim 1, wherein the generated timestamp is stored as two 32-bit values.

10. The method of claim 1, wherein the predetermined time range lies within a range of time between Jan. 1, 0001 A.D., at a time of 00:00:00.00000 and Dec. 31, 4294 A.D., at a time of 23:59:59:99999, wherein said times are in a format of HH:MM:SS.FFFFF, where HH represents hours, MM represents minutes, SS represents seconds, and FFFFF represents tens of microseconds.

11. The method of claim 1, wherein the predetermined time range lies within a range of time between Jan. 1, 0001 A.D., at a time of 00:00:00.00000 and Dec. 31, 18446 A.D., at a time of 23:59:59:99999, wherein said times are in a format of HH:MM:SS.FFFFF, where HH represents hours, MM represents minutes, SS represents seconds, and FFFFF represents tens of microseconds.

12. An apparatus for generating a timestamp, comprising:
   a range validation module configured to receive at least one of date and time information and validate that the received at least one of date and time information is within a predetermined time range;
   a component separation module configured to receive validated at least one of date and time information from the range validation module and separate the validated at least one of date and time information into a plurality of components;
   a timestamp generating module configured to receive the plurality of components from the component separation module, scale each of the plurality of components by a predetermined scale factor to generate a plurality of scaled components and combine the plurality of scaled components to generate the timestamp.

13. The apparatus of claim 12, wherein said plurality of components comprises at least one of a year component, a day component, an hour component, a minute component and a second component.

14. The apparatus of claim 12, wherein said plurality of components comprises a year component, a day component, an hour component, a minute component and a second component.

15. The apparatus of claim 14, wherein the timestamp generating module is further configured to scale each of the plurality of components by:

multiplying the year component by a year scale factor;

multiplying the day component by a day scale factor;

multiplying the hour component by an hour scale factor;

multiplying the minute component by a minute scale factor; and multiplying the second component by a second scale factor.

16. The apparatus of claim 15, wherein the plurality of components further comprises a subseconds component and the timestamp generating module is further configured to scale the subseconds component by multiplying the subseconds component by a subseconds scale factor.

17. The apparatus of claim 15, wherein the timestamp generating module is configured to combine the plurality of scaled components by adding the plurality of scaled components.

18. The apparatus of claim 15, wherein the timestamp generating module is configured to combine the plurality of scaled components by concatenating the plurality of scaled components.

19. The apparatus of claim 12, wherein the timestamp generating module is configured to generate a 64-bit timestamp value.

20. The apparatus of claim 12, wherein the timestamp generating module is configured to generate a timestamp that includes two 32-bit values.

21. The apparatus of claim 12, wherein the range validation module is configured to determine whether the received information lies within a range of time between Jan. 1, 0001 A.D., at a time of 00:00:00.00000 and Dec. 31, 4294 A.D., at a time of 23:59:59:99999, wherein said times are in a format of HH:MM:SS.FFFFF, where HH represents hours, MM represents minutes, SS represents seconds, and FFFFF represents tens of microseconds.

22. The apparatus of claim 12, wherein the range validation module is configured to determine whether the received information lies within a range of time between Jan. 1, 0001 A.D., at a time of 00:00:00.00000 and Dec. 31, 18446 A.D., at a time of 23:59:59:99999, wherein said times are in a format of HH:MM:SS.FFFFF, where HH represents hours, MM represents minutes, SS represents seconds, and FFFFF represents tens of microseconds.

23. An article of manufacture comprising a computer program carrier readable by a computer and embodying one or more instructions executable by the computer for generating a timestamp, said computer program comprising:

program instructions for receiving at least one of date and time information;

program instructions for validating that the received at least one of date and time information is within a predetermined time range;

program instructions for separating the received at least one of date and time information into a plurality of components;

program instructions for scaling each of the plurality of components by a predetermined scale factor to generate a plurality of scaled components; and program instructions for combining the plurality of scaled components to generate the timestamp.

24. The article of manufacture of claim 23, wherein said plurality of components comprises at least one of a year component, a day component, an hour component, a minute component and a second component.

25. The article of manufacture of claim 23, wherein said plurality of components comprises a year component, a day component, an hour component, a minute component and a second component.

26. The article of manufacture of claim 25, wherein said scaling comprises:

multiplying the year component by a year scale factor;

multiplying the day component by a day scale factor;

multiplying the hour component by an hour scale factor;

multiplying the minute component by a minute scale factor; and multiplying the second component by a second scale factor.

27. The article of manufacture of claim 26, wherein the plurality of components further comprises a subseconds component and said scaling further comprises multiplying the subseconds component by a subseconds scale factor.

28. The article of manufacture of claim 26, wherein the plurality of scaled components are combined by adding the plurality of scaled components.

29. The article of manufacture of claim 26, wherein the plurality of scaled components are combined by concatenating the plurality of scaled components.

30. The article of manufacture of claim 23, wherein the generated timestamp is a 64-bit value.

31. The article of manufacture of claim 23, wherein the generated timestamp is stored as two 32-bit values.

32. The article of manufacture of claim 23, wherein the predetermined time range lies within a range of time between Jan. 1, 0001 A.D., at a time of 00:00:00.00000 and Dec. 31, 4294 A.D., at a time of 23:59:59:99999, wherein said times are in a format of HH:MM:SS.FFFFF, where HH represents hours, MM represents minutes, SS represents seconds, and FFFFF represents tens of microseconds.

33. The article of manufacture of claim 23, wherein the predetermined time range lies within a range of time between Jan. 1, 0001 A.D., at a time of 00:00:00.00000 and Dec. 31, 18446 A.D., at a time of 23:59:59:99999, wherein said times are in a format of HH:MM:SS.FFFFF, where HH represents hours, MM represents minutes, SS represents seconds, and FFFFF represents tens of microseconds.

* * * * *